United States Patent
Tanaka et al.

(10) Patent No.: US 8,969,819 B2
(45) Date of Patent: Mar. 3, 2015

(54) RADIATION IMAGE PICKUP APPARATUS AND METHOD OF DRIVING THE SAME

(75) Inventors: Tsutomu Tanaka, Kanagawa (JP);
Makoto Takatoku, Kanagawa (JP);
Yasuhiro Yamada, Kanagawa (JP);
Ryoichi Ito, Aichi (JP)

(73) Assignee: Sony Corporation, Tokyo (JP)

( * ) Notice: Subject to any disclaimer, the term of this patent is extended or adjusted under 35 U.S.C. 154(b) by 508 days.

(21) Appl. No.: 13/027,328

(22) Filed: Feb. 15, 2011

(65) Prior Publication Data

US 2011/0204246 A1 Aug. 25, 2011

(30) Foreign Application Priority Data

Feb. 25, 2010 (JP) ................................. 2010-040746

(51) Int. Cl.
| | |
|---|---|
| *G01T 1/24* | (2006.01) |
| *H01L 29/66* | (2006.01) |
| *H01L 27/146* | (2006.01) |
| *G01T 1/20* | (2006.01) |
| *H04N 5/225* | (2006.01) |
| *H04N 5/374* | (2011.01) |
| *H04N 5/378* | (2011.01) |

(52) U.S. Cl.
CPC ........ *H01L 27/14676* (2013.01); *G01T 1/2018* (2013.01); *H04N 5/2251* (2013.01); *H04N 5/374* (2013.01); *H04N 5/378* (2013.01)
USPC ........................ 250/370.08; 257/271; 257/266

(58) Field of Classification Search
USPC ................. 250/370.08, 370.14; 257/271, 266
See application file for complete search history.

(56) References Cited

U.S. PATENT DOCUMENTS

| 6,600,160 B2 | 7/2003 | Kobayashi et al. |
| 2005/0035273 A1* | 2/2005 | Machida et al. ........... 250/214.1 |

FOREIGN PATENT DOCUMENTS

| CN | 1543186 A | 11/2004 |
| JP | 11-307756 | 11/1999 |

OTHER PUBLICATIONS

Chinese Office Examination issued in connection with related Chinese Patent Application No. 201110040526.9 dated Jul. 2, 2014.

* cited by examiner

*Primary Examiner* — David J Makiya
*Assistant Examiner* — Kenneth J Malkowski
(74) *Attorney, Agent, or Firm* — Dentons US LLP

(57) ABSTRACT

A radiation image pickup apparatus allowed to restore a change in characteristics in a pixel transistors caused by radiation, and a method of driving the same are provided. The radiation image pickup apparatus includes: a pixel section including a plurality of unit pixels and generating an electrical signal based on incident radiation, each of the unit pixels including one or more pixel transistors and a photoelectric conversion element; a drive section for selectively driving the unit pixels of the pixel section; and a characteristic restoring section including a first constant current source for annealing and a selector switch for changing a current path from the unit pixels to the first constant current source at the time of non-measurement of the radiation, and allowing an annealing current to flow through the pixel transistor, thereby restoring characteristics of the pixel transistor.

15 Claims, 10 Drawing Sheets

RADIATION IMAGE PICKUP APPARATUS AND METHOD OF DRIVING THE SAME

BACKGROUND OF THE INVENTION

1. Field of the Invention

The present invention relates to a radiation image pickup apparatus and a method of driving the same, and more specifically to a radiation image pickup apparatus (a radiation beam reader) reading information based on radiation by converting the wavelength of radiation represented by α-rays, β-rays, γ-rays or X-rays.

2. Description of the Related Art

In a radiation image pickup apparatus, a charge based on input information photoelectric-converted by a photoelectric conversion section is transferred to an external capacity, and the charge is converted into a signal voltage in the external capacity. When a charge is transferred from the capacity of the photoelectric conversion section to the external capacity to be converted into a signal voltage, a relatively large S/N is achievable.

When a configuration in which a plurality of pixels are arranged is used, the length of a signal line reading signals from pixels is increased according to the number of pixels; therefore, a parasitic capacitance may be formed. For example, the case where 2000 horizontal×2000 vertical pixels with a size of 200 μm×200 μm are arranged to form an area sensor with a size equivalent to an X-ray film, for example, 40 cm×40 cm will be considered below.

In the case of the area sensor with a size equivalent to the X-ray film, a capacity is formed by an overlap between a gate electrode and a source region of a transistor transferring a charge. The overlap depends on the number of pixels; therefore, when an overlap capacity Cgs has approximately 0.05 pF at each pixel, a capacity of 0.05 pF×2000 pixels=100 pF is formed in one signal line.

As the capacity (sensor capacity) Cs of the photoelectric conversion section is approximately 1 pF, an output voltage V0 of the signal line is $V0=\{Cs/(Cs+Cgs\times1000)\}\times V1$ where a signal voltage generated in a pixel is V1, and the output voltage is approximately $\frac{1}{100}$. In other words, in the case where an area sensor with a large area is configured, the output voltage largely declines.

Moreover, to read moving pictures under such circumstances, sensitivity and a high-speed operation allowing the photoelectric conversion section to read 30 or more pictures per second are necessary. In particular, there is a demand for minimizing the dose of X-rays to be applied in nondestructive testing including X-ray diagnosis in medical care; therefore, higher sensitivity allowing a signal charge amount to be increased by 100 to 400 times is desired.

On the other hand, in related art, as described in Japanese Unexamined Patent Application Publication No. 11-307756, specifically in paragraphs 0040 to 0044 and FIG. 7 therein, a configuration in which a field-effect transistor having a gate receiving a signal charge generated in a photoelectric conversion section is included and a source follower circuit reading out a signal voltage based on the signal charge to a signal line by the field-effect transistor is arranged in each pixel is used. In the source follower circuit, high-speed signal readout is allowed even in the case where a capacity formed in the signal line is large.

In a radiation image pickup apparatus including a source follower circuit of this kind, each pixel includes a drive element section including a bottom-gate field-effect transistor (pixel transistor) and a PIN (Positive Intrinsic Negative Diode) photodiode. The field-effect transistor includes a semiconductor layer (channel layer) made of microcrystalline silicon or polycrystalline silicon.

SUMMARY OF THE INVENTION

However, in the radiation image pickup apparatus, there is an issue that X-rays or the like for measurement cause a crystal defect in a semiconductor layer of a pixel transistor and around an interface between the semiconductor and a gate insulating film or an interlayer insulating film. When such a defect occurs, the threshold value (Vth) of the pixel transistor is changed (shifted), and characteristics vary from one transistor to another; therefore, it is difficult to perform correct photoelectric conversion (image pickup) of radiation corresponding to incident energy.

It is desirable to provide a radiation image pickup apparatus allowed to restore a change in characteristics occurring in a pixel transistor, and a method of driving the same.

According to an embodiment of the invention, there is provided a radiation image pickup apparatus including: a pixel section including a plurality of unit pixels and generating an electrical signal based on incident radiation, each of the unit pixels including one or more pixel transistors and a photoelectric conversion element; a drive section for selectively driving the unit pixels of the pixel section; and a characteristic restoring section allowing an annealing current to flow through the pixel transistor, thereby restoring characteristics of the pixel transistor. The characteristic restoring section includes a first constant current source for annealing and a selector switch for changing a current path from the unit pixels to the first constant current source at the time of non-measurement of the radiation.

According to an embodiment of the invention, there is provided a method of driving a radiation image pickup apparatus, the radiation image pickup apparatus including a pixel section, which includes a plurality of unit pixels and generates an electrical signal based on incident radiation, and a drive section for selectively driving the unit pixels of the pixel section, the each of the unit pixels including one or more pixel transistors and a photoelectric conversion element, the method including steps of: arranging a constant current source for annealing; and switching a current path from the unit pixels to the constant current source for annealing at the time of non-measurement of the radiation to allow an annealing current to flow through the pixel transistor, thereby restoring characteristics of the pixel transistor.

In the radiation image pickup apparatus or the method of driving a radiation image pickup apparatus according to the embodiment of the invention, at the time of non-measurement of radiation, a current path from the unit pixels is changed to the constant current source for annealing, and an annealing current flows through the pixel transistor. Therefore, heat is generated in a channel layer of the transistor to restore characteristics of the pixel transistor deteriorated by radiation.

In the radiation image pickup apparatus or the method of driving a radiation image pickup apparatus according to the embodiment of the invention, the constant current source for annealing is arranged, and at the time of non-measurement of radiation, the current path from the unit pixels is changed to the constant current source for annealing, and an annealing current flows through the pixel transistor; therefore, characteristics of the pixel transistor deteriorated by a crystal defect are restored, and accurate measurement corresponding to incident energy is allowed to be performed.

Other and further objects, features and advantages of the invention will appear more fully from the following description.

DETAILED DESCRIPTION OF THE PREFERRED EMBODIMENTS

Preferred embodiments of the invention will be described in detail below referring to the accompanying drawings. Descriptions will be given in the following order.
1. First Embodiment (radiation image pickup apparatus)
2. Descriptions of functions and effects
3. Modifications
4. Second Embodiment

FIRST EMBODIMENT

System Configuration

Figure 1:
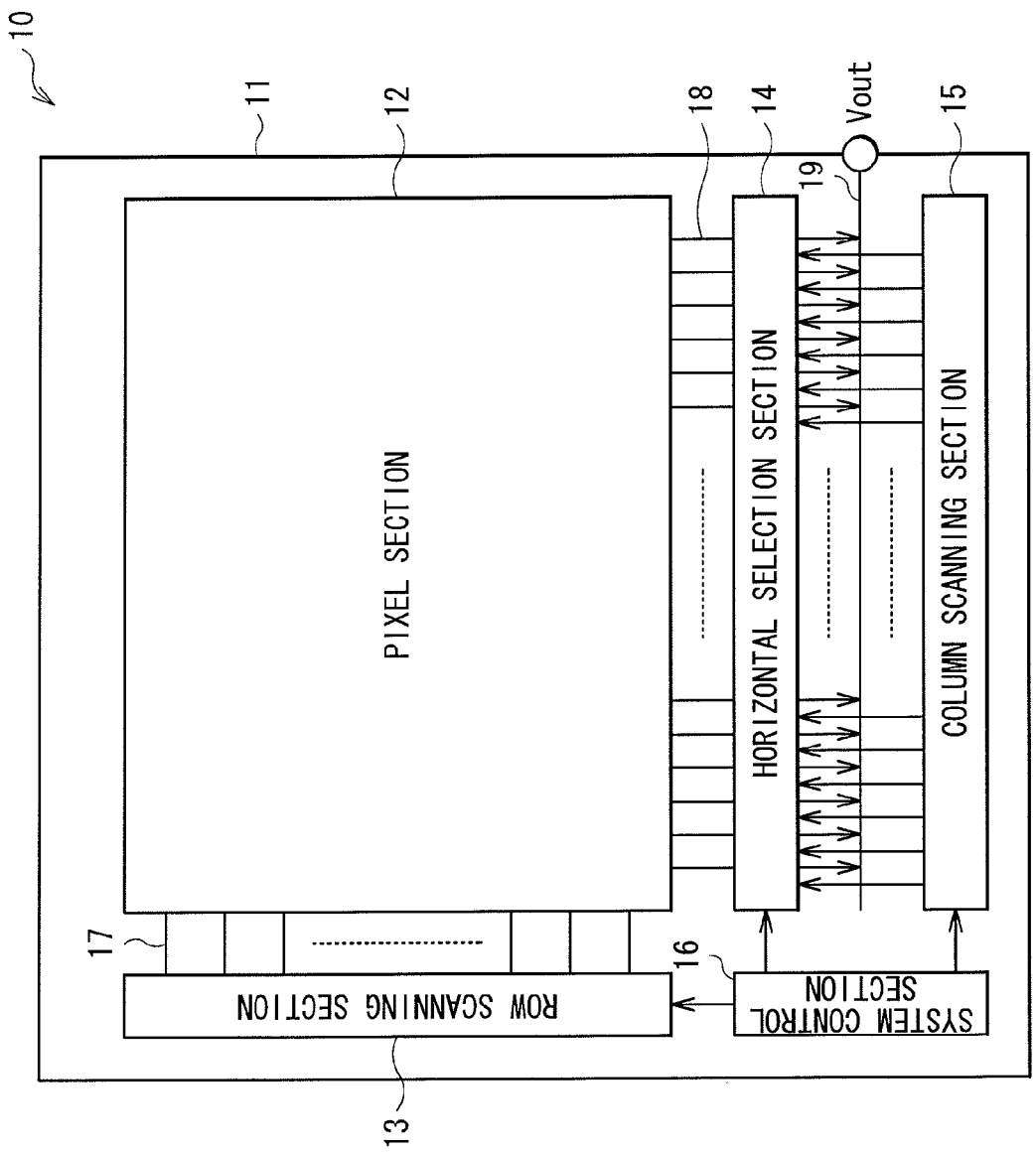
FIG. 1 is a system configuration diagram of a photoelectric conversion device of a radiation measuring instrument according to a first embodiment of the invention.

FIG. 1 illustrates a system configuration of a photoelectric conversion device 10 of a radiation image pickup apparatus according to a first embodiment of the invention. The radiation image pickup apparatus is configured by arranging a wavelength converter 40 (refer to FIG. 3) on the photoelectric conversion device 10, and reads information based on radiation by converting the wavelength of radiation represented by α-rays, β-rays, γ-rays or X-rays.

The photoelectric conversion device 10 includes a pixel section 12 on a substrate 11 made of an insulating material such as glass, and a peripheral circuit section (drive section) including, for example, a row scanning section (vertical drive section) 13, a horizontal selection section 14, a column scanning section (horizontal drive section) 15 and a system control section 16 is arranged around the pixel section 12.

In the pixel section 12, unit pixels (which may be hereinafter simply referred to as "pixels") each including a photoelectric conversion section (photoelectric conversion element) which generates a charge amount of photoelectric charge corresponding to the light amount of incident light to accumulate the photoelectric charge therein are two-dimensionally arranged in a matrix form. A specific configuration of the unit pixel will be described later.

In the pixel section 12, pixel drive lines 17 are wired to respective pixel rows of a pixel arrangement in a matrix form along a row direction (a pixel arrangement direction in the pixel rows), and vertical signal lines 18 are wired to respective pixel columns along a column direction (a pixel arrangement direction in the pixel columns). The pixel drive lines 17 are provided to transmit a drive signal for signal readout from pixels. In FIG. 1, each of the pixel drive lines 17 is illustrated as one wire, but each of the pixel drive lines 17 is not limited thereto. An end of each of the pixel drive lines 17 is connected to an output end corresponding to each row of the row scanning section 13.

The row scanning section 13 is configured of a shift register, an address decoder and the like, and is a pixel drive section driving the pixels of the pixel section 12, for example, on a pixel row-by-pixel row basis. Signals generated from the unit pixels of a pixel row selected and scanned by the row scanning section 13 are supplied to the horizontal selection section 14 through respective vertical signal lines 18. The horizontal selection section 14 is configured of amplifiers, horizontal selection switches and the like which are arranged for the vertical signal lines 18, respectively.

The column scanning section 15 is configured of a shift register, an address decoder and the like, and sequentially scans and drives horizontal selection switches of the horizontal selection section 14. The signals from the pixels transmitted through the vertical signal lines 18 are sequentially transmitted to horizontal signal lines 19 by selection scanning by the column scanning section 15, and the signals are transmitted to outside of the substrate 11 through the horizontal signal lines 19.

A circuit part configured of the row scanning section 13, the horizontal selection section 14, the column scanning section 15 and the horizontal signal lines 19 is configured of one or both of a circuit and an external control IC formed on the substrate 11 such as a glass substrate. Alternatively, the circuit part may be formed on another substrate connected by a cable or the like.

The system control section 16 receives a clock supplied from outside of the substrate 11, data commanding an operation mode, or the like, or outputs data such as internal information of the photoelectric conversion device 10. The system control section 16 further includes a timing generator generating various timing signals, and controls the drive of a peripheral circuit part such as the row scanning section 13, the horizontal selection section 14 and the column scanning section 15 in response to the various timing signals generated in the timing generator.

As will be described in detail later, the system control section 16 changes a voltage supplied to each of terminals of the unit pixels in response to a command from outside or automatically at the time of non-measurement of radiation, and changes the path of a current from the unit pixels to perform a restoring operation on a pixel transistor by an annealing current. More specifically, the time of non-measurement includes timings such as the time of starting an apparatus, after applying radiation, and the time of regular correction.

Circuit Configuration of Pixel

Figure 2:
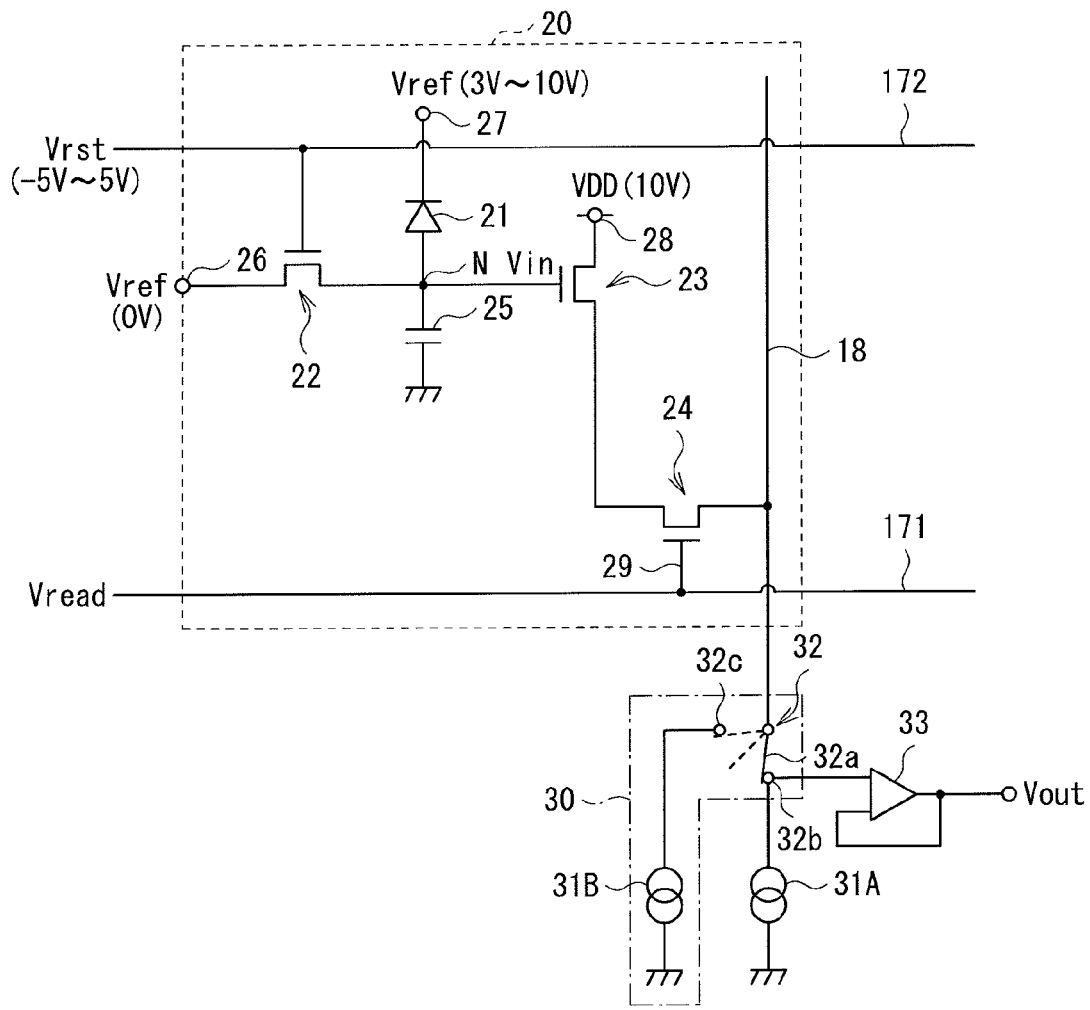
FIG. 2 is a circuit diagram of a unit pixel.

FIG. 2 illustrates a circuit configuration of the unit pixel 20. In the unit pixel 20, a reset transistor 22, a read transistor 23 and a row selection transistor 24 are arranged with a photoelectric conversion element 21. For example, two lines as pixel drive lines 17, more specifically, a row selection line 171 and a reset control line 172 are wired to the unit pixel 20 in each pixel row.

The reset transistor 22, the read transistor 23 and the row selection transistor 24 each are configured of, for example, an N-channel field-effect transistor. However, a conductive combination of the reset transistor 22, the read transistor 23 and the row selection transistor 24 is only one example, and the combination is not limited thereto.

The photoelectric conversion element 21 is, for example, a PIN (Positive Intrinsic Negative Diode) photodiode, and when a standard potential Vxref of, for example, approximately 3 V to 10 V is applied to a cathode (a terminal 27), the photoelectric conversion element 21 generates a charge amount of signal charge corresponding to the light amount of incident light. An anode of the photoelectric conversion element 21 is connected to a storage node N. The storage node N includes a capacity component 25, and a signal charge generated in the photoelectric conversion element 21 is accumulated in the storage node N. The photoelectric conversion element 21 may be connected between the storage node N and a ground (GND).

The reset transistor 22 is connected between a terminal 26 to which a reference potential Vref is supplied and the storage node N, and turns on in response to a reset signal Vrst with, for example, an amplitude of −5 V to 5V to reset the potential of the storage node N to the reference potential Vref.

In the read transistor 23, a gate and a terminal 28 (a drain) thereof are connected to the storage node N and a power source, respectively, and the read transistor 23 receives the signal charge generated in the photoelectric conversion element 21 from the gate thereof to output a signal voltage corresponding to the signal charge.

The row selection transistor 24 is connected between a source of the read transistor 23 and the vertical signal line 18, and the row selection transistor 24 turns on in response to a row scanning signal Vread to output a signal from the read transistor 23 to the vertical signal line 18. The row selection transistor 24 may be connected between the drain of the read transistor 23 and the terminal 28.

For the reset transistor 22, the read transistor 23 and the row selection transistor 24, for example, a silicon-based semiconductor such as microcrystalline silicon or polycrystalline silicon is used. Alternatively, an oxide semiconductor such as an indium-gallium-zinc oxide (InGaZnO) or zinc oxide (ZnO) may be used. Microcrystalline silicon, polycrystalline silicon (polysilicon) and the oxide semiconductor have higher mobility µ than amorphous silicon; therefore, specifically high-speed signal readout by the read transistor 23 is achievable.

A measurement constant current source 31A (a second constant current source) is connected to an end of the vertical signal line 18. A source follower circuit is configured of the read transistor 23 and the measurement constant current source 31A connected to the source of the read transistor 23 through the row selection transistor 24 and the vertical signal line 18. In the source follower circuit, even in the case where a capacity formed in the vertical signal line 18 is large, high-speed signal readout is achievable. A signal read by the read transistor 23 for source follower is applied to an amplifier 33, which configures an input section of the horizontal selection section 14, through the vertical signal line 18 on a pixel column-by-pixel column basis.

A selector switch 32 is arranged in a preceding stage of the measurement constant current source 31A on the vertical signal line 18. The selector switch 32 is configured of a moving contact 32a and fixed contacts 32b and 32c. The measurement constant current source 31A and an input end of the amplifier 33 are connected to the fixed contact 32b, and an annealing constant current source 31B (a first constant current source) is connected to the fixed contact 32c. The moving contact 32a is connected to the fixed contact 32b at the time of measurement of radiation (in a radiation detection period), and is connected to the fixed contact 32c or is in an open state (a state where the moving contact 32a is connected to neither the fixed contact 32b nor the fixed constant 32c) at the time of non-measurement (a period where radiation is not detected). A characteristic restoring section 30 according to an embodiment of the invention is configured of the annealing constant current source 31B, the selector switch 32 and the above-described system control section 16.

For example, a voltage of −7 V is supplied to the measurement constant current source 31A at the time of measurement of radiation and the annealing constant current source 31B at the time of non-measurement. At the time of measurement of radiation, the reference potential Vref, the standard potential Vxref, a power source potential VDD, and the line selection potential Vread are supplied to the terminal 26 of the reset transistor 22, the terminal 27 of the photoelectric conversion element 21, the terminal 28 of the read transistor 23, and a terminal 29 (a gate electrode) of the row selection transistor 24, respectively. Moreover, at the time of non-measurement of radiation, the voltages supplied to these terminals 26 to 29 are changed to a predetermined voltage value so that a predetermined annealing current (for example, 1 mA) is allowed to flow between the source and drain electrodes of each transistor. Therefore, for example, a plurality of voltage sources with different voltage values are connected to the terminals 26 to 29, respectively. As described above, such a change in a voltage to be supplied to each terminal and an operation of switching the moving contact 32a of the selector switch 32 are performed under the control of the system control section 16.

Figure 3:
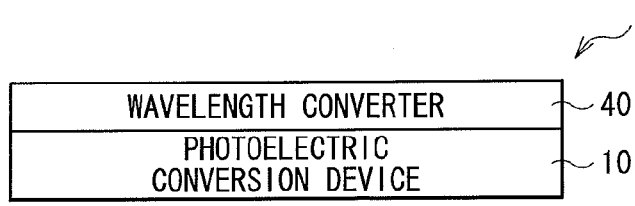
FIG. 3 is a schematic configuration diagram of a radiation image pickup apparatus configured of a combination of a photoelectric conversion device and a wavelength converter.

The radiation image pickup apparatus 1 according to the embodiment is configured by arranging the wavelength converter 40 on the photoelectric conversion device 10 (on a light reception side of the pixel section 12) which is configured by arranging the above-described unit pixels 20 in a matrix form (refer to FIG. 3). The wavelength converter 40 converts the wavelength of radiation represented by α-rays, β-rays, γ-rays or X-rays to a wavelength of a sensitivity region of the photoelectric conversion device 10, and the photoelectric conversion device 10 thereby reads information based on radiation. The wavelength converter 40 is, for example, a phosphor (for example, a scintillator) converting radiation such as X-rays into visible light. More specifically, a planarization film made of an organic planarization film, a spin-on glass material or the like is formed on the photoelectric conversion element 21, and a phosphor film is formed of CsI, NaI, CaF$_2$ or the like on the planarization film to form the wavelength converter 40.

Sectional Configuration of Pixel

Figure 4:
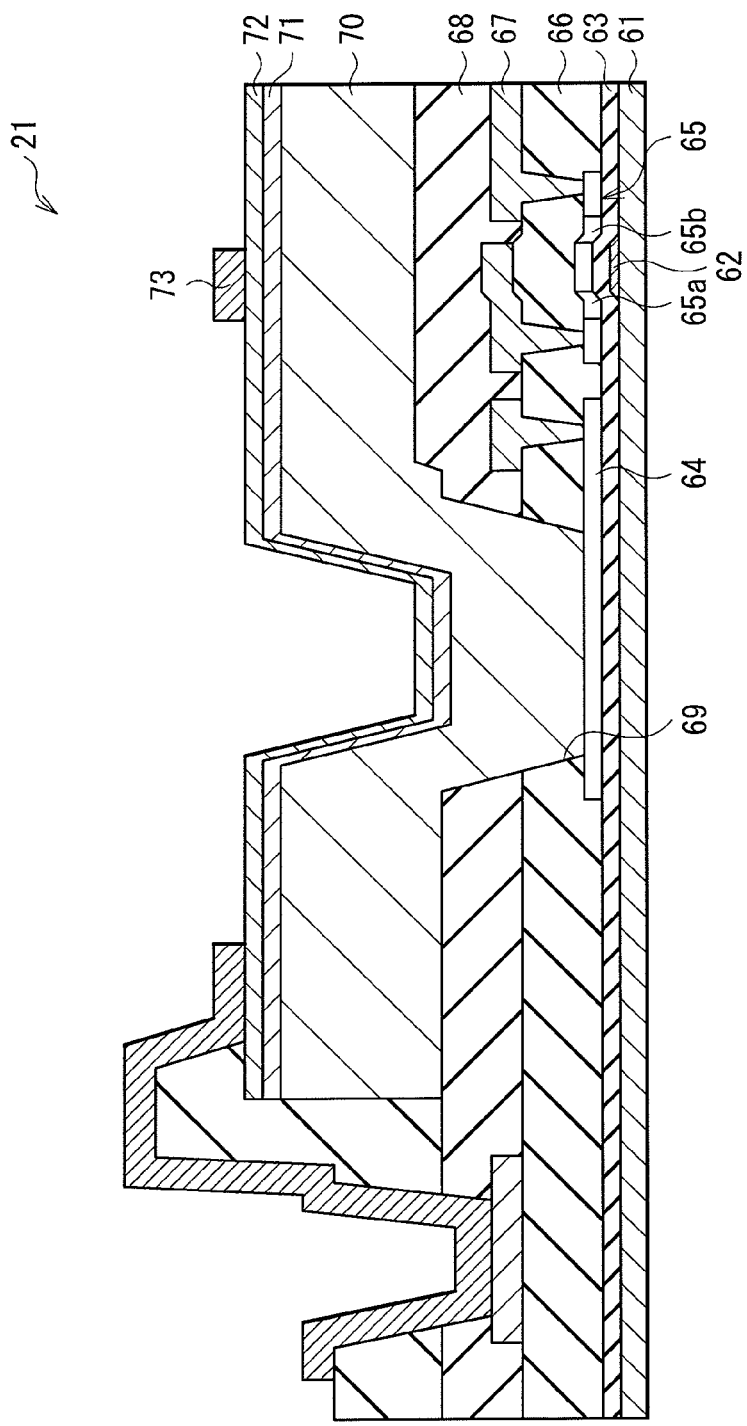
FIG. 4 is a sectional view of a pixel configuration.

FIG. 4 illustrates a sectional configuration of a main part (the unit pixel 20) of the photoelectric conversion device 10. The case where the photoelectric conversion element 21 is configured of a PIN photodiode will be described as an example below.

In the photoelectric conversion device 10, a gate electrode 62 made of Ti, Al, Mo, W, Cr or the like is formed on an insulating substrate 61 such as a glass substrate, and a gate insulating film 63 made of SiNx, SiO$_2$ or the like is formed on the gate electrode 62. For example, a p-type semiconductor layer (p+ region) 64 (a first semiconductor layer) configuring a PIN photodiode is formed on the gate insulating film 63.

The p-type semiconductor layer 64 also serves as a lower electrode for reading a signal charge photoelectric-converted by the photoelectric conversion element 21. A semiconductor layer 65 of a pixel transistor such as the read transistor 23 is further formed on the gate insulating film 63. In the semiconductor layer 65, LDDs (Lightly Doped Drains) 65a and 65b are arranged between a channel region and a drain-source region so as to reduce a leakage current. The semiconductor layer 65 is made of, for example, microcrystalline silicon or polycrystalline silicon.

A first interlayer insulating film 66 made of SiNx, $SiO_2$ or the like is arranged on the p-type semiconductor layer 64 and the semiconductor layer 65 of the pixel transistor. A wiring layer 67 including a signal line for readout and various kinds of wires is formed of Ti, Al, Mo, W, Cr or the like on the first interlayer insulating film 66. A second interlayer insulating film 68 made of SiNx, $SiO_2$, an organic insulating film or the like is arranged on the wiring layer 67.

In an insulating layer configured of the first and second interlayer insulating films 66 and 68, a contact hole 69 is formed. A third semiconductor layer (i-type semiconductor layer 70) made of a semiconductor of a conductive type between a p-type and an n-type is formed on the second interlayer insulating film 68. The area of the i-type semiconductor layer 70 is larger than the area of an opening on an upper side of the contact hole 69. The i-type semiconductor layer 70 is in contact with the p-type semiconductor layer 64 through the contact hole 69.

A second semiconductor layer (for example, an n-type semiconductor layer (n+ region) 71) with substantially the same shape as that of the i-type semiconductor layer 70 is laminated on the i-type semiconductor layer 70. The photoelectric conversion element 21 (a PIN photodiode) is configured of the p-type semiconductor layer 64 (the first semiconductor layer), the i-type semiconductor layer 70 (the third semiconductor layer) and the n-type semiconductor layer 71 (the second semiconductor layer).

In the photoelectric conversion element 21, the semiconductor layers 64, 70 and 71 are allowed to be formed of amorphous silicon, microcrystalline silicon, polycrystalline silicon or the like. A material such as germanium or carbon may be introduced into such silicon to change spectral sensitivity. The photoelectric conversion element 21 may have an inverted configuration in which a lower part is made of an n-type semiconductor and an upper part is made of a p-type semiconductor.

An upper electrode 72 for applying a specified voltage to the photoelectric conversion element 21 is formed of a transparent conductive film such as ITO (Indium Tin Oxide) on the n-type semiconductor layer 71. Power source wiring 73 for supplying a voltage to the upper electrode 72 is arranged on the upper electrode 72. The power source wiring 73 is made of a material with lower resistance than that of the transparent conductive film of the upper electrode 72, such as Ti, Al, Mo, W or Cr. The power source wiring 73 is formed on a whole surface of the pixel section 12 in a mesh form so that, for example, the unit pixels 20 are surrounded with the power source wiring 73. A protective film (not illustrated) made of SiN or the like may be further formed on the upper electrode 72.

Figure 5:
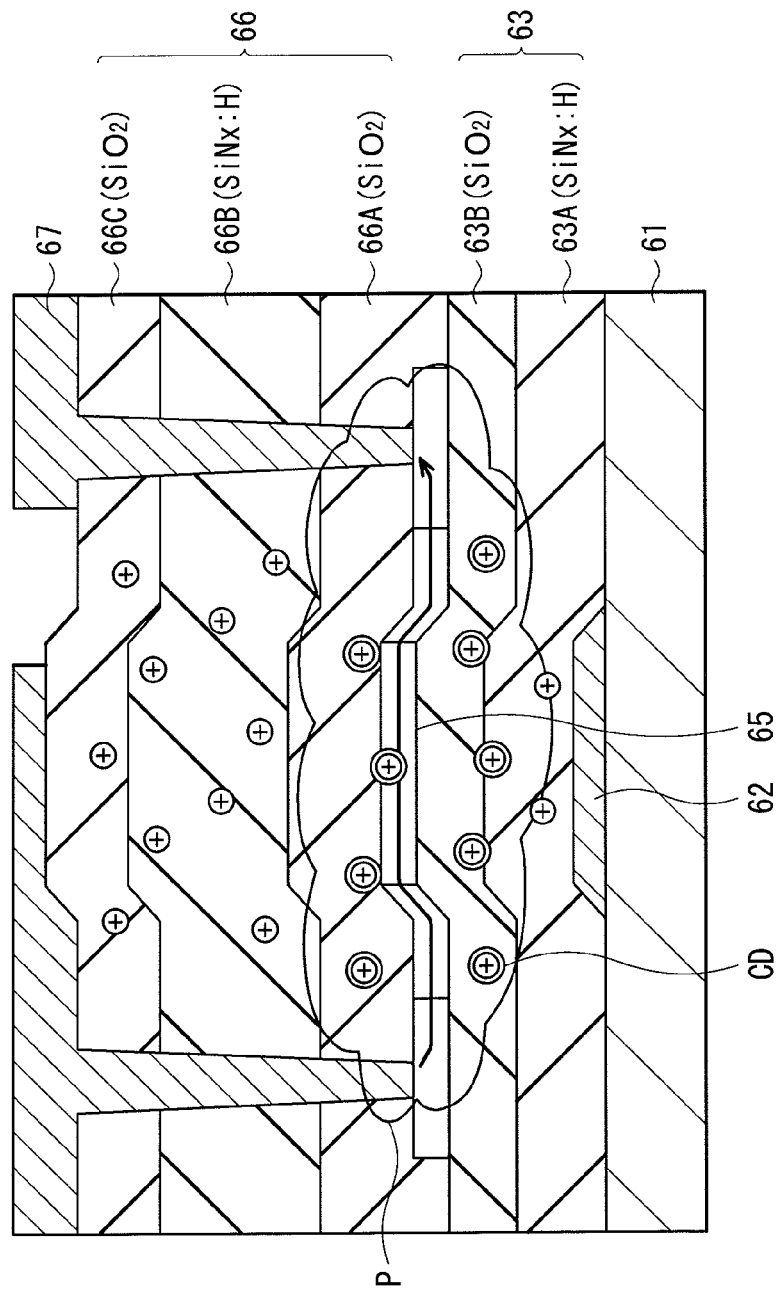
FIG. 5 is an enlarged view of a pixel transistor part in a sectional configuration in FIG. 4.

FIG. 5 illustrates specific sectional configurations of the gate insulating film 63 and the first interlayer insulating film 66 of the pixel transistor in such a unit pixel 20. The gate insulating film 63 has, for example, a laminate configuration including a nitride film (SiNx: H) 63A including hydrogen (H) with a thickness of 50 nm and an oxide film ($SiO_2$) 63B with a thickness of 30 nm. In this case, the nitride film 63A is arranged on a side close to the gate electrode 62, and the oxide film 63B is arranged on a side close to the semiconductor layer 65, but the positions thereof may be inverted. In other words, the oxide film 63B and the nitride film 63A may be arranged on the side close to the gate electrode 62 and the side close to the semiconductor layer 65, respectively. However, in the case where polycrystalline silicon is used for the semiconductor layer 55, the oxide film 63B is typically arranged in contact with the semiconductor layer 55. Moreover, as the nitride film 63A, a SiON:H film including hydrogen may be used.

The first interlayer insulating film 66 is configured by laminating, for example, an oxide film ($SiO_2$) 66A with a thickness of 100 nm, a nitride film (SiNx:H) 66B including hydrogen (H) with a thickness of 200 nm and an oxide film ($SiO_2$) 66C with a thickness of 100 nm in order on the semiconductor layer 65 and the oxide film 63B. Note that these sectional configurations of the gate insulating film 63 and the first interlayer insulating film 66 are only an example, and the sectional configurations of the gate insulating film 63 and the first interlayer insulating film 66 are not limited to the configurations illustrated in FIG. 5. However, a nitride film (SiNx:H) including hydrogen is preferably arranged in proximity to an oxide film ($SiO_2$), because the SiNx film is formed of, for example, silane ($SiH_4$), disilane ($Si_2H_6$), ammonia ($NH_3$) as a material by, for example, a plasma CVD (Chemical Vapor Deposition) method; therefore, the SiNx film includes a higher content of hydrogen (H) having an effect of capturing a crystal defect than the $SiO_2$ film. Therefore, the SiNx film is a supply source of H, and as will be described later, more crystal defects are allowed to be captured, and a restoring operation on the pixel transistor is accelerated.

Functions and Effects

In the radiation image pickup apparatus 1 having such a configuration, at the time of measurement of radiation, as illustrated in FIG. 2, the moving contact 32a of the switch 31 of the source follower circuit is connected to the fixed contact 32b. When radiation, for example, X-rays enters into the radiation image pickup apparatus 1, the X-rays are converted into visible light by the wavelength converter 40 (refer to FIG. 3) made of a phosphor (scintillator). When a specified voltage is applied to the photoelectric conversion element 21 through the power source wiring 73 and the upper electrode 72, the visible light is converted (photoelectric-converted) into a signal charge. The charge generated by photoelectric conversion is collected in the p-type semiconductor layer 64 as an accumulation layer (in FIG. 2, the storage node N), and the charge is read out as a current from the accumulation layer to be supplied to the gate of the source follower-type read transistor 23. The read transistor 23 generates a signal voltage based on the signal charge. When the row selection transistor 24 turns on in response to the row scanning signal Vread, the signal generated from the read transistor 23 is transmitted (read out) to the vertical signal lines 18 by the source follower circuit configured of the read transistor 23, the row selection transistor 24 and the measurement constant current source 31A. The amplifier 33 configuring an input section of the horizontal selection section 14 amplifies and then outputs the read signal through the vertical signal lines 18 on a pixel column-by-pixel column basis.

In the radiation image pickup apparatus 1 according to the embodiment, the measurement of radiation (X-rays) is performed in such a manner, but the application of X-rays causes a crystal defect in an element. Therefore, in particular, in the pixel transistors, an issue such as a change in the threshold value (Vth) occurs. For example, in the read transistor 23, as illustrated in FIG. 5, crystal defects CD occur in proximity to an interface between the semiconductor layer 65 made of microcrystalline silicon or polycrystalline silicon and the first interlayer insulating film 66 or in the second interlayer insulating film 68.

Therefore, in the embodiment, the annealing constant current source 31B is arranged in addition to the measurement constant current source 31A to restore deterioration of an element by supplying a predetermined current (an annealing current) to the pixel transistor at the time of the non-measurement of radiation. In other words, when a relatively more positive voltage than the voltage of the source electrode or the drain electrode of the pixel transistor is applied to the gate electrode of the pixel transistor, a current (an annealing current) is allowed to flow between the source electrode and the drain electrode to anneal a channel semiconductor layer, thereby performing a restoring operation according to a characteristic shift amount. At this time, when an oxide film ($SiO_2$) in proximity to an interface with the channel semiconductor layer has a thin thickness (for example, 50 nm or less, preferably within a range of 5 nm to 20 nm both inclusive), characteristics is effectively restored.

Figure 6:
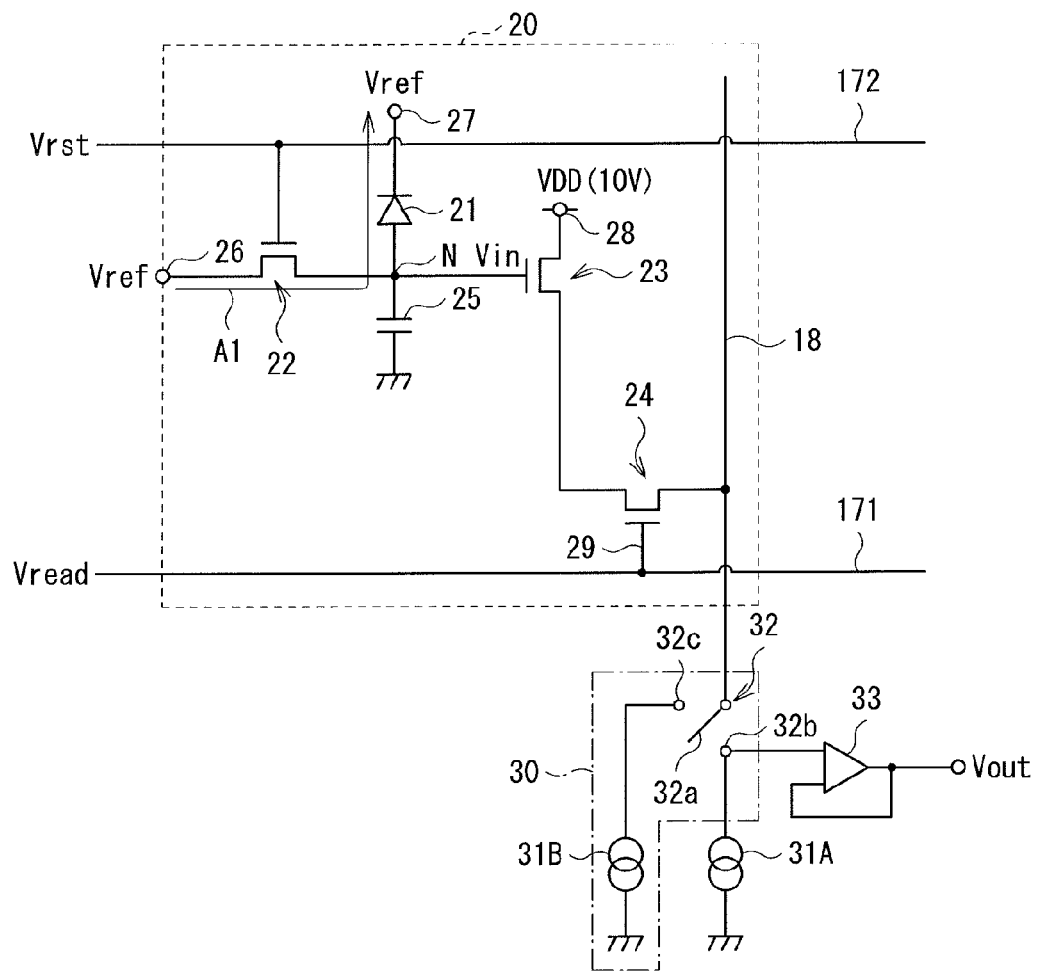
FIG. 6 is an illustration for describing a flow of a current at the time of restoring characteristics of a reset transistor.

More specifically, in the case where the characteristics of the reset transistor 22 are restored, as illustrated in FIG. 6, the moving contact 32a of the switch 31 is in an open state (in a state where the moving contact 32a is connected to neither the fixed contact 32b nor the fixed contact 32c), and a supplied voltage to the terminal 26 of the reset transistor 22, the supplied voltage to the terminal 27 of the photoelectric conversion element 21 and the supplied voltage (Vrst) to the gate electrode of the reset transistor 22 are changed to, for example, 0 V, −2 V and 15 V, respectively. Therefore, as illustrated in the drawing, an annealing current A1 (for example, 1 mA) flows through the reset transistor 22.

Figure 7:
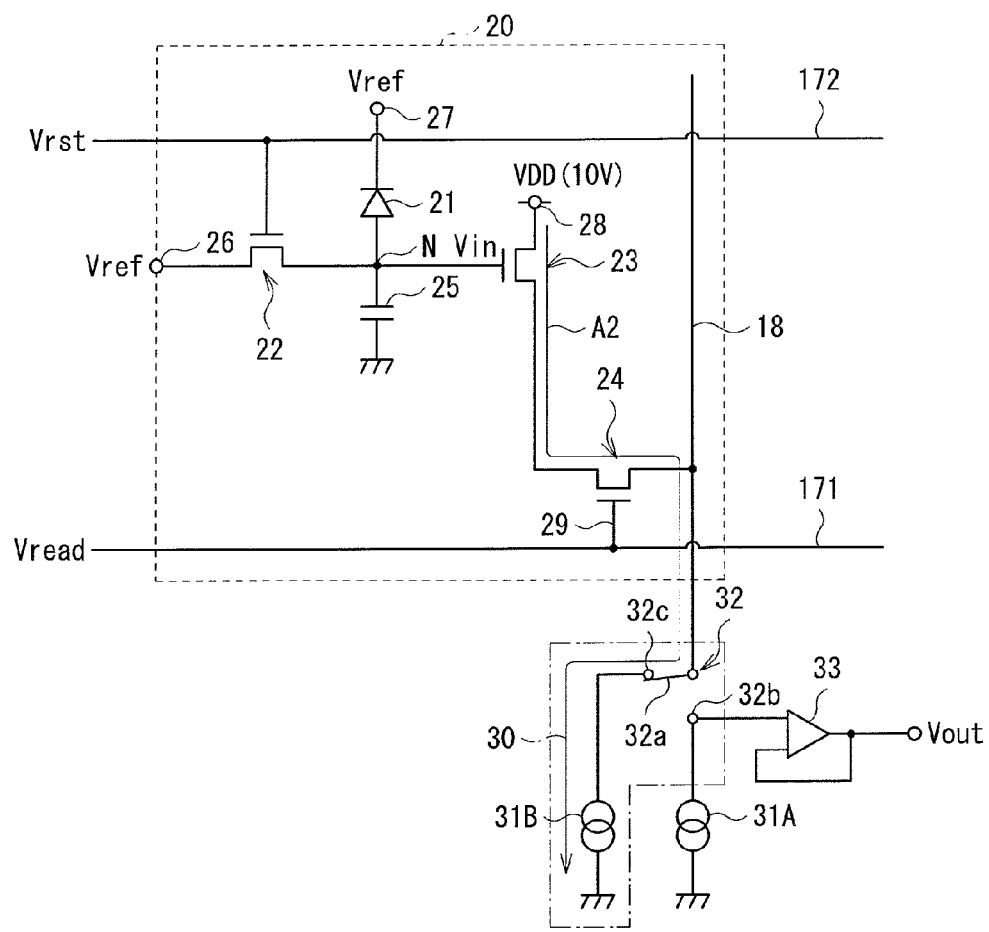
FIG. 7 is an illustration for describing a flow of a current at the time of restoring characteristics of a read transistor and a row selection transistor.

Next, in the case where the characteristics of the read transistor 23 and the row selection transistor 24 are restored, as illustrated in FIG. 7, the switch 31 is turned to connect the moving contact 32a to the fixed contact 32c. Therefore, the vertical signal line 18 is connected to the annealing constant current source 31B, and the supplied voltages to the terminal 26 of the reset transistor 22, the terminal 28 of the read transistor 23 and the terminal 29 (gate) of the row selection transistor 24 are changed to values different from those at the time of measurement. For example, the supplied voltages to the terminal 26 of the reset transistor 22 (a gate potential of the read transistor 23), the terminal 28 of the read transistor 23 and the terminal 29 (gate) of the row selection transistor 24 are changed to 10 V, −5 V and 10 V, respectively. Therefore, as illustrated in the drawing, an annealing current A2 (for example, 1 mA) flows through the read transistor 23 and the row selection transistor 24.

When the annealing currents flow through the reset transistor 22, the read transistor 23 and the row selection transistor 24, in the semiconductor layer 65 (a channel layer) illustrated in FIG. 5, Joule heat depending on the channel resistance and a current value of the semiconductor layer 65 is generated. When the temperature of the heat at this time instantaneously reaches 200° C. or over, heat generation affects the first interlayer insulating film 66 and the gate insulating film 63 above and below the semiconductor layer 65. In a range P affected by such heat generation, the crystal defects CD in proximity to a channel are captured (terminated). A circled crystal defect CD indicates a captured crystal defect. Hydrogen (H) effectively works to capture such a crystal defect CD. The hydrogen contents in the oxide films ($SiO_2$) 66B, 68A, 68B and 68D are low, but in the embodiment, the nitride films (SiNx:H) 66A and 68C with a high hydrogen content are arranged in proximity to the oxide films 66B, 68A, 68B and 68D, and the nitride films (SiNx:H) 66A and 68C function as the supply source of H, thereby allowing more crystal defects CD to be captured. Therefore, the characteristics of the reset transistor 22, the read transistor 23 and the row selection transistor 24 are restored. Thus, accurate measurement corresponding to incident energy of radiation is allowed to be performed.

Figure 8:
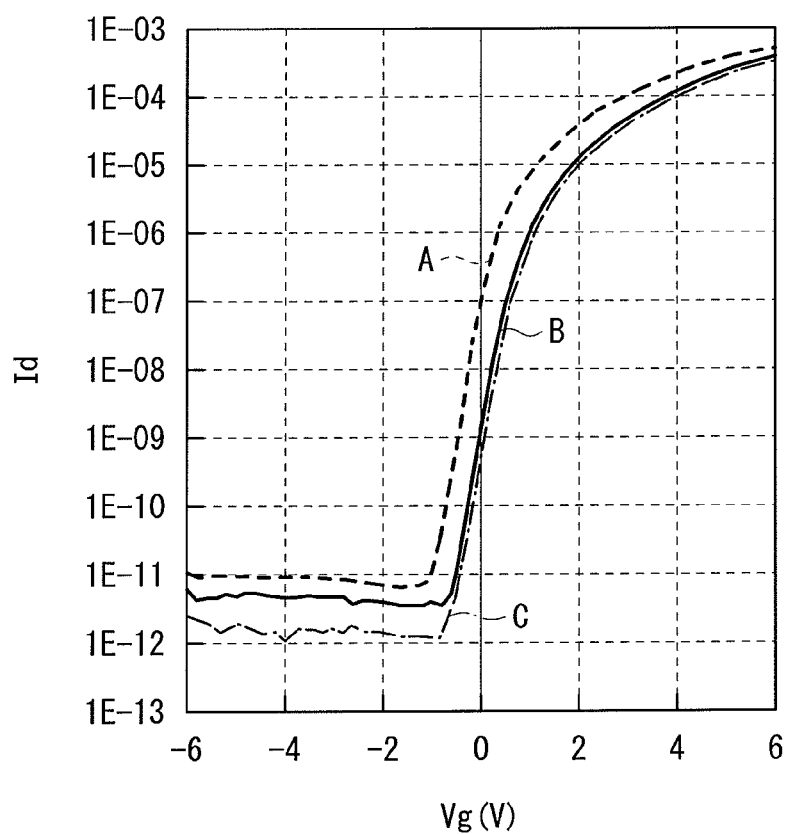
FIG. 8 is an illustration for describing the characteristic restoring state of a transistor deteriorated due to X-ray radiation.

FIG. 8 illustrates a result (a relationship between a gate voltage (Vg) and a drain current (Id)) of performing a restoring operation by allowing an annealing current flow through a sample (a field-effect transistor) deteriorated by application of X-rays. In the drawing, A indicates characteristics of the sample irradiated with X-rays of 110 Gy. In the sample, the threshold value Vth is changed by −0.5 V to cause deterioration. A result of allowing an annealing current of 1 mA to flow through the sample once is B, and a result of allowing the annealing current to flow through the sample twice is C. It is obvious that when the annealing current flows through the sample, the characteristics of the sample are restored. Moreover, it is obvious that in first annealing, almost all defects are captured so as to restore the characteristics of the sample to an initial state; therefore, in second annealing, the characteristics of the sample are not restored much, that is, even annealing is further performed, the characteristics of the sample are not changed. In a sample which is not deteriorated by the application of X-rays, annealing is not effective to restore the characteristics of the sample, but annealing is effective for a deteriorated sample. Moreover, when a restoring operation is performed under optimum conditions, an excessive characteristic shift exceeding a level before deterioration does not occur. In addition, it was confirmed that there was no difference in the maximum value of the mobility p between the deteriorated sample and a sample restored by annealing, and element performance did not change.

Modification 1

Figure 9:
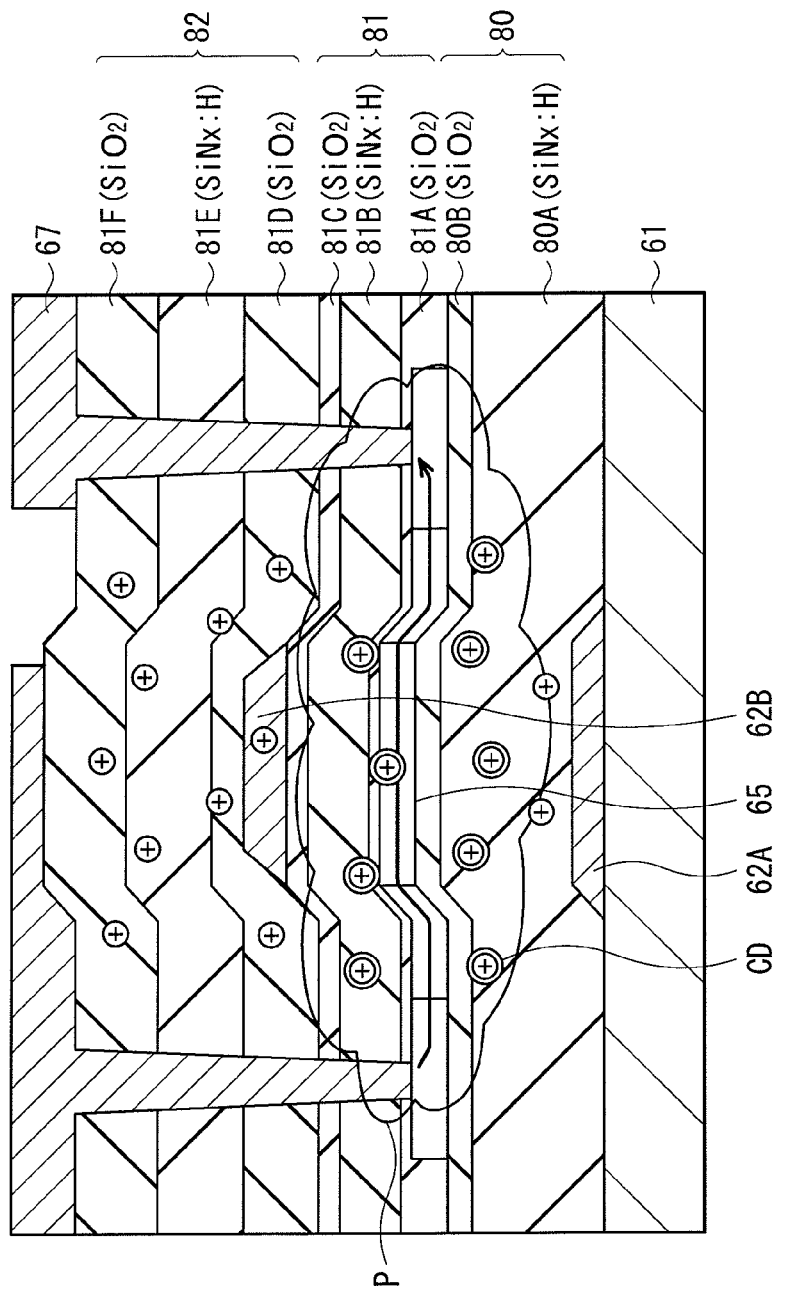
FIG. 9 is a sectional view illustrating a modification of a sectional configuration of a pixel transistor.

FIG. 9 illustrates a modification of a sectional configuration of the pixel transistor. In the modification, the influence of a defect is prevented more effectively, and in this case, two gate electrodes 62A and 62B are arranged above and below the semiconductor layer 65 of the pixel transistor. A first gate insulating film 80 has a laminate configuration including, for example, a nitride film (SiNx:H) 80A including hydrogen (H) with a thickness of 80 nm and an oxide film ($SiO_2$) 80B with a thickness of 10 nm. The nitride film 80A is arranged on a side close to the gate electrode 62A, and the oxide film 80B is arranged on a side close to the semiconductor layer 65. A second gate insulating film 81 is configured by laminating, for example, an oxide film ($SiO_2$) 81A with a thickness of 10 nm, a nitride film (SiNx:H) 81B including hydrogen (H) with a thickness of 70 nm and an oxide film ($SiO_2$) film 81C with a thickness of 10 nm on the semiconductor layer 65 and the oxide film 80B. An interlayer insulating film 82 is configured by laminating an oxide film ($SiO_2$) 81D with a thickness of 100 nm, a nitride film (SiNx:H) 81E including hydrogen (H) with a thickness of 200 nm and an oxide film ($SiO_2$) 81F with a thickness of 100 nm in order.

The material of the gate electrodes 62A and 62B is the same metal as that of the gate electrode 62 in the above-described embodiment, and the gate electrodes 62A and 62B are electrically connected to each other. When the gate electrodes 62A and 62B are arranged above and below the semiconductor layer 65 in such a manner, the influence of heat generation is not exerted on a wide area around the semiconductor layer 65. Therefore, the influence to a scintillator material or an organic material which is formed on pixels and forms the photoelectric conversion element 21 is preventable.

Other configurations, functions and effects are the same as those in the first embodiment, and will not be further described.

SECOND EMBODIMENT

Figure 10:
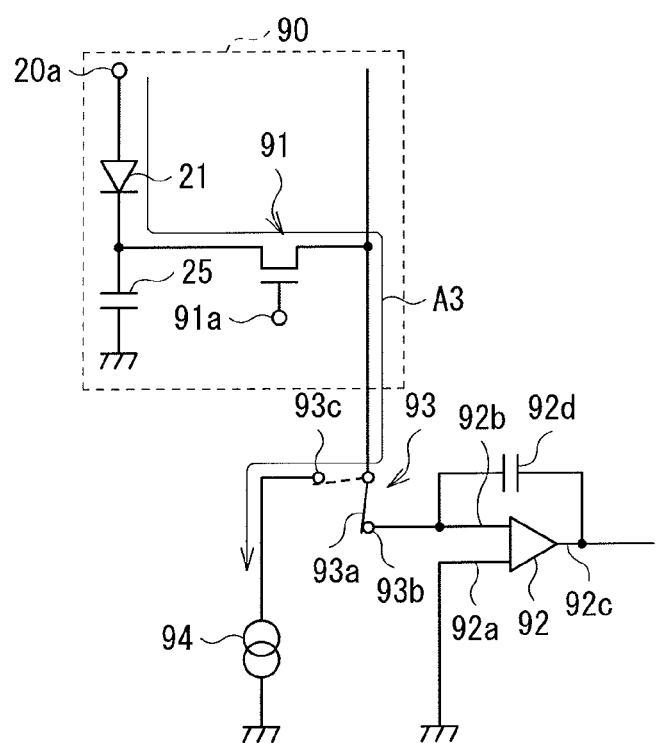
FIG. 10 is a circuit diagram of a unit pixel according to a second embodiment of the invention.

In the above-described embodiment, an example in which the drive circuit of the pixel is configured of an active drive circuit is described, but the drive circuit of the pixel may be a passive drive circuit as illustrated in FIG. 10. Note that like components are denoted by like numerals as of the above-described embodiment and will not be further described.

In the embodiment, a unit pixel 90 is configured of the photoelectric conversion element 21, the capacity component 25 and a read transistor 91. The read transistor 91 is connected between the storage node N and the vertical signal line 18, and when the read transistor 91 turns on in response to the row scanning signal Vread, the read transistor 91 transmits a signal charge accumulated in the storage node N to the vertical signal line 18.

An end of the vertical signal line 18 is connected to an input terminal 92b of a measurement charge amplifier 92 having another internal terminal 92a connected to a ground. The input terminal 92b and an output terminal 92c of the measurement charge amplifier 92 are connected to each other through a capacitor 92d. The signal charge transmitted to the vertical signal line 18 enters into the measurement charge amplifier 92 configuring an input section of the horizontal selection section 14 on a pixel column-by-pixel column basis. A selector switch 93 is arranged between the measurement charge amplifier 92 and the vertical signal line 18. The selector switch 93 is configured of a moving contact 93a and fixed contacts 93b and 93c. The input terminal 92b of the measurement charge amplifier 92 is connected to the fixed contact 93b, and an annealing contact current source 94 is connected to the fixed contact 93c. The moving contact 93a is connected to the fixed contact 93b at the time of measurement (in a radiation detection period), and is connected to the fixed contact 93c at the time of non-measurement. In the embodiment, the selector switch 93, the annealing constant current source 94 and the system control section 16 configure a characteristic restoring section in the invention.

In the embodiment, at the time of measurement of radiation, as indicated by a solid line in FIG. 10, the moving contact 93a of the selector switch 93 is connected to the fixed contact 93b, and a predetermined bias voltage (for example, 0 V) and a read voltage (for example, 5 V) are applied to the terminal 20a (an anode) of the photoelectric conversion element 21 and the terminal 91a (a gate electrode) of the read transistor 91, respectively. Therefore, a charge generated by the photoelectric conversion element 21 based on the application of X-rays is transmitted (read out) to the vertical signal line 18 through the read transistor 91. The measurement charge amplifier 92 amplifies and then outputs the read signal through the vertical signal line 18.

Next, in the case where the characteristics of the read transistor 91 are restored, as indicated by a broken line in FIG. 10, the moving contact 93a of the selector switch 93 is connected to the fixed contact 93c. Therefore, the vertical signal line 18 is connected to the annealing constant current source 94, and the supplied voltage to the terminal 20a (the anode) of the photoelectric conversion element 21 and the supplied voltage to the terminal 91a (the gate electrode) of the read transistor 91 are changed to, for example, −5 V and 10 V, respectively. At the same time, a voltage of −7 V is supplied to the annealing constant current source 94; therefore, an annealing current A3 (for example, 1 mA) flows through the read transistor 91. Other configurations, functions and effects are the same as those in the first embodiment, and will not be further described.

Modification 2

Figure 11:
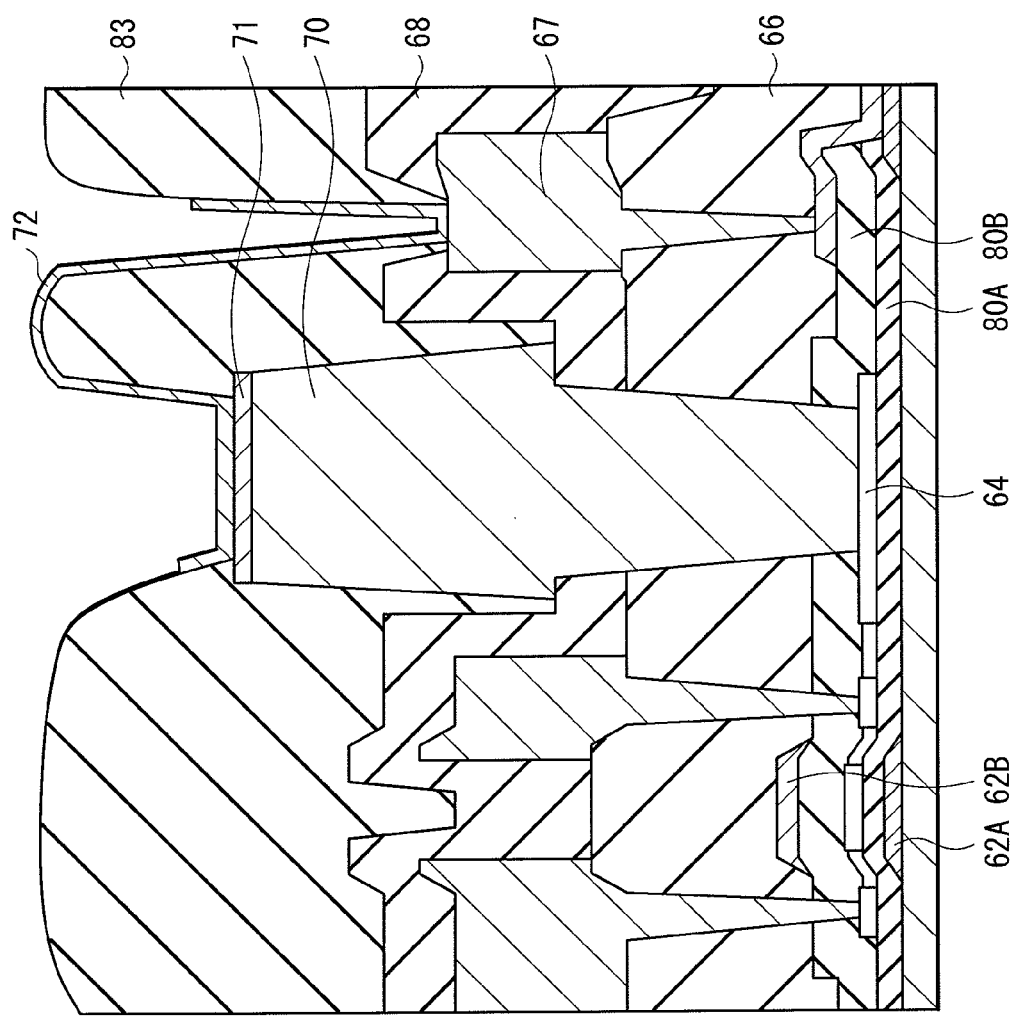
FIG. 11 is a sectional view illustrating a modification of a pixel configuration.

FIG. 11 illustrates a modification of a sectional configuration of the unit pixel. In the first embodiment, a layer configuration of the PIN photodiode in which a charge accumulation layer (storage node) is the p-type semiconductor layer 64 and the power source wiring 73 is connected to the upper electrode 72 is described as an example; however, a connection configuration in the modification is opposite to the layer configuration. More specifically, power source wiring (not illustrated) is connected to the p-type semiconductor layer 64 to take a charge out of the upper electrode 72 (the upper electrode 72 is connected to the storage node). Moreover, a planarization film 83 is formed over the second interlayer insulating film 68, the i-type semiconductor layer 70 and the n-type semiconductor layer 71. The planarization film 83 has openings facing the n-type semiconductor layer 71 and the wiring layer 67, and the upper electrode 72 is formed on a part including the openings of the planarization film 83.

In the modification, a charge taken out of the upper electrode 72 is collected in the wiring layer 67 as an accumulation layer (storage node) and is read out as a current by the read transistor 23. In such a configuration, the storage node is allowed to be formed on a light reception side; therefore, there is a merit that a decline in photoelectric conversion efficiency is allowed to be reduced. As the pixel transistor, the pixel transistor including two gate electrodes 62A and 62B described in the second embodiment is used, but the pixel transistor may include only one gate electrode. Moreover, a protective film (not illustrated) made of SiN or the like may be further formed on the upper electrode 72.

Although the present invention is described referring to the embodiments, the invention is not limited thereto, and may be variously modified. For example, the voltage and the current value supplied to each terminal when an annealing current flows through the pixel transistor are not limited to those in the above-described embodiments, and are arbitrarily selected.

The present application contains subject matter related to that disclosed in Japanese Priority Patent Application JP 2010-040746 filed in the Japan Patent Office on Feb. 25, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A radiation image pickup apparatus comprising:
   a pixel section including a unit pixel and generating an electrical signal based on incident radiation, the unit pixel including one or more pixel transistors and a photoelectric conversion element;
   a drive section operable to selectively drive the unit pixel; and
   a characteristic restoring section including a first constant current source and a selector switch, the characteristic restoring section being effective to restore characteristics of the one or more pixel transistors,
   wherein,
   the drive section includes a second constant current source, at a time of non-measurement of radiation, the selector switch is operable to disconnect the unit pixel from the second constant current source, and at a time of measurement of radiation, the selector switch is operable to electrically disconnect the unit pixel from the first constant current source and connect the unit pixel to the second constant current source.

2. The radiation image pickup apparatus according to claim 1, wherein the drive section is operable to change a voltage applied to a terminal of the unit pixel in response to a command or automatically at the time of non-measurement of radiation.

3. The radiation image pickup apparatus according to claim 1, wherein:

the pixel section includes a plurality of the unit pixels, and each unit pixel includes, as the one or more pixel transistors, (i) a first transistor operable to receive, as the pixel transistor, a signal charge collected in the photoelectric conversion element from a gate electrode thereof to read out an electrical signal based on the signal charge, (ii) a second transistor operable to reset the gate electrode of the first transistor to a reference potential, and (iii) a third transistor operable to selectively output a signal transmitted from the first transistor, the second constant current source is configured as a source follower circuit with the first transistor, an output end of the third transistor is electrically connected to the second constant current source at the time of measurement of radiation, and when the characteristic restoring section restores characteristics of the first transistor and the third transistor, the characteristic restoring section is operable to electrically connect the output end of the third transistor to the first constant current source by the selector switch to allow a current to flow to the first transistor and the third transistor.

4. The radiation image pickup apparatus according to claim 1, wherein:

the one or more pixel transistors includes a field-effect transistor, and the characteristic restoring section is operable to apply a first voltage that is more positive than a second voltage of a source electrode or a drain electrode of the field-effect transistor, the first voltage being applied to a gate electrode of the field-effect transistor to allow current to flow through a channel layer between the source electrode and the drain electrode, thereby generating heat in the channel layer and an area surrounding the channel layer.

5. The radiation image pickup apparatus according to claim 3, wherein:

the plurality of pixels are arranged in a matrix form, each of the unit pixels includes a fourth transistor, as the one or more pixel transistors, selectively outputting a signal charge collected in the photoelectric conversion element, and when the characteristic restoring section restores characteristics of the fourth transistor, the characteristic restoring section is operable to electrically connect an output end of the fourth transistor to the first constant current source by the selector switch to allow a current to flow to the fourth transistor.

6. The radiation image pickup apparatus according to claim 4, wherein, the field-effect transistor includes, as a channel layer, a semiconductor layer made of microcrystalline or polycrystalline silicon.

7. The radiation image pickup apparatus according to claim 1, wherein, the photoelectric conversion element includes a transparent electrode, an n-type semiconductor layer, an i-type semiconductor layer and a p-type semiconductor layer in order from a light incident side, a signal charge is collected on a transparent electrode side, and the p-type semiconductor layer is connected to power source wiring.

8. The radiation image pickup apparatus according to claim 1, wherein, the photoelectric conversion element includes a transparent electrode, an n-type semiconductor layer, an i-type semiconductor layer and a p-type semiconductor layer in order from a light incident side, a signal charge is collected on a p-type semiconductor layer side, and the transparent electrode is connected to power source wiring.

9. The radiation image pickup apparatus according to claim 4, wherein:

the field-effect transistor includes a gate insulating film between a semiconductor layer and a gate electrode, and the gate insulating film includes (i) a first silicon oxide film in contact with the semiconductor layer, and (ii) a first silicon nitride film arranged between the first silicon oxide film and the gate electrode, and the first silicon nitride film includes hydrogen, and has a thickness of 50 nm or less.

10. The radiation image pickup apparatus according to claim 9, wherein:

the field-effect transistor includes an interlayer insulating film on the semiconductor layer, and the interlayer insulating film includes (i) a second silicon oxide film in contact with the semiconductor layer, and (ii) a second silicon nitride film arranged between the second silicon oxide film and a source-drain wiring layer, and the second silicon nitride film includes hydrogen, and has a thickness of 50 nm or less.

11. The radiation image pickup apparatus according to claim 1, wherein at the time of non-measurement of radiation, the selector switch is operable to electrically connect the unit pixel to the first constant current source.

12. A method of driving a radiation image pickup apparatus, the radiation image pickup apparatus including (i) a pixel section having a unit pixel operable to generate an electrical signal based on incident radiation, and (ii) a drive section operable to selectively drive the unit pixel the unit pixel including one or more pixel transistors and a photoelectric conversion element, the method comprising steps of:

at a time of non-measurement of radiation, controlling a selector switch to disconnect the unit pixel from the second constant current source, and at a time of measurement of radiation, controlling the selector switch to electrically disconnect the unit pixel from the first constant current source and connect the unit pixel to the second constant current source, wherein, the characteristics of the one or more pixel transistors are restored at the time of non-measurement of radiation.

13. The method of claim 12, further comprising:
at the time of non-measurement of radiation, controlling the selector switch to electrically connect the unit pixel to the first constant current source.

14. A radiation image pickup apparatus comprising:
a pixel section including a plurality of unit pixels operable to generate an electrical signal based on incident radiation, each of the unit pixels including one or more pixel transistors and a photoelectric conversion element;
a drive section operable to selectively drive the unit pixels of the pixel section; and
a characteristic restoring section including a first constant current source and a selector switch operable to (i) change a current path from one of the unit pixels to the first constant current source at the time of non-measurement of the radiation, and (ii) allow a current to flow through a first pixel transistor, thereby restoring characteristics of the first pixel transistor,
wherein,
the first pixel transistor is a field-effect transistor,
the field-effect transistor includes a gate insulating film between a semiconductor layer and a gate electrode, and the gate insulating film includes (i) a first silicon oxide film in contact with the semiconductor layer, and (ii) a first silicon nitride film arranged between the first silicon oxide film and the gate electrode, and
the field effect transistor includes an interlayer insulating film on the semiconductor layer, and the interlayer insulating film includes (i) a second silicon oxide film in contact with the semiconductor layer, and (ii) a second silicon nitride film arranged between the second silicon oxide film and a source-drain wiring layer.

15. The radiation image pickup apparatus according to claim 14, wherein:
the plurality of pixels are arranged in a matrix form, and
when the characteristic restoring section restores characteristics of the second transistor, the characteristic restoring section is operable to turn an output end of the third transistor into an open state by the selector switch to allow a current to flow to the second transistor.

* * * * *